(12) United States Patent
Park et al.

(10) Patent No.: US 7,250,649 B2
(45) Date of Patent: Jul. 31, 2007

(54) CAPACITOR OF A MEMORY DEVICE AND FABRICATION METHOD THEREOF

(75) Inventors: Young-soo Park, Suwon-si (KR); Jung-hyun Lee, Yongin-si (KR); Choong-rae Cho, Gimhae-si (KR); June-mo Koo, Seoul (KR); Suk-pil Kim, Yongsin-si (KR); Sang-min Shin, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 2 days.

(21) Appl. No.: 11/120,184

(22) Filed: May 3, 2005

(65) Prior Publication Data

US 2006/0001070 A1   Jan. 5, 2006

(30) Foreign Application Priority Data

May 3, 2004  (KR) .................... 10-2004-0030928

(51) Int. Cl.
*H01L 29/76* (2006.01)

(52) U.S. Cl. .................... 257/295; 257/68; 257/71; 257/296; 257/298; 257/300; 257/303; 257/306

(58) Field of Classification Search .............. 257/295, 257/296, 301, 306
See application file for complete search history.

(56) References Cited

U.S. PATENT DOCUMENTS

| 6,368,910 B1 | 4/2002 | Sheu et al. .................. 438/240 |
| 2003/0057464 A1* | 3/2003 | Nam ........................... 257/295 |
| 2003/0146460 A1* | 8/2003 | Zambrano et al. .......... 257/295 |
| 2004/0135182 A1* | 7/2004 | An et al. ..................... 257/295 |

FOREIGN PATENT DOCUMENTS

KR   2003-0060602   7/2003

* cited by examiner

*Primary Examiner*—Evan Pert
*Assistant Examiner*—Tan Tran
(74) *Attorney, Agent, or Firm*—Lee & Morse, P.C.

(57) ABSTRACT

A capacitor of a memory device, and a method of fabricating the same, includes a lower electrode electrically coupled to a doping region of a transistor structure, the lower electrode having a metal electrode and a metal oxide electrode, a ferroelectric layer covering and extending laterally along the lower electrode, and an upper electrode formed on the ferroelectric layer.

6 Claims, 9 Drawing Sheets

CAPACITOR OF A MEMORY DEVICE AND FABRICATION METHOD THEREOF

BACKGROUND OF THE INVENTION

1. Field of the Invention

The present invention relates to a capacitor of a memory device and a fabrication method thereof. More particularly, the present invention relates to a capacitor of a memory device having a vertical metal electrode/metal oxide electrode and a method of fabricating the same.

2. Description of the Related Art

A ferroelectric random access memory (FRAM) is a nonvolatile memory device that may be used in computers, MP3 players, digital cameras, personal digital assistants (PDAs), and other electronic devices. The capacitance of a ferroelectric capacitor per unit area should be increased in order to provide a highly-integrated ferroelectric memory device, which includes one transistor and one capacitor.

For a given dielectric material, a capacitor's area may be increased in order to increase its capacitance C, as given by Equation (1) below.

$$C = \varepsilon \frac{A}{t} \quad (1)$$

where $\varepsilon$ is the permittivity, A is the effective area and t is the thickness of a dielectric material.

The capacitance can be increased by reducing the thickness and increasing the effective area of the dielectric layer. However, when using a planar capacitor structure, increasing the capacitor's area limits integration of a semiconductor device. Thus, there is an inherent trade off between increasing integration and increasing capacitance. For example, if the space for the capacitor is reduced to increase integration, the planar area of the capacitor is also reduced, decreasing its capacitance. Therefore, there is a continuing effort to develop a three-dimensional capacitor structure that both increases capacitance and improves integration of a device having the capacitor.

There are two basic structures of a three-dimensional ferroelectric capacitor, a trench type and a stack type. The trench type uses a lower metal electrode formed in a recess on a transistor structure, with a ferroelectric thin film deposited on the lower metal electrode. The stack type uses a ferroelectric thin film deposited on a lower metal electrode protruding from a transistor structure. These two types of three-dimensional ferroelectric capacitors will be explained with reference to FIGS. 1A and 1B, which illustrate cross-sectional views of a trench type and a stack type three-dimensional ferroelectric capacitor, respectively.

FIG. 1A illustrates a trench type ferroelectric capacitor, in which a third insulating layer 3, e.g. silicon dioxide ($SiO_2$) is deposited on a second insulating layer 2, and the third insulating layer 3 is etched, thereby forming a concave opening 5. A ruthenium (Ru) or Ru oxide layer 6 is formed on the concave opening 5 and, using chemical mechanical polishing (CMP), the upper surface of the third insulating layer 3 is exposed. Thus, the Ru or the Ru oxide layer 6 remains only inside the concave opening 5. Then, a ferroelectric thin film 7 and an upper electrode 8 are sequentially deposited, thereby forming a three-dimensional ferroelectric capacitor. The capacitor also includes a first insulating layer 1, a Ru plug 4, and a polysilicon plug 9 for connecting the capacitor to a semiconductor device.

The ferroelectric capacitor has a structure of lower electrode/ferroelectric material/upper electrode. The lower electrode in particular should use a metal oxide electrode in order to maintain the good fatigue characteristics of the ferroelectric capacitor. However, a metal oxide electrode normally used for the ferroelectric capacitor, e.g., iridium dioxide ($IrO_2$), or ruthenium dioxide ($RuO_2$), breaks down in a high-temperature vacuum atmosphere typically required during the ferroelectric thin film deposition. Thus, if a ferroelectric thin film is deposited on the metal oxide electrode, the metal oxide electrode may react with the ferroelectric thin film, deteriorating its ferroelectric properties. Therefore, the lower electrode of the ferroelectric capacitor should be formed such that a metal electrode covers the metal oxide electrode.

As a result, a thickness of the lower electrode increases. When the lower electrode 6 having an increased thickness is deposited on the narrow diameter trench or concave opening 5, the aspect ratio of the remaining opening rapidly increases. Thus, stable step coverage is difficult to achieve during the formation of the ferroelectric thin film. When depositing a typical ferroelectric material such as lead zirconate titanate (PZT) or barium strontium titanate (BST) on a lower electrode in the opening having a high aspect ratio using chemical vapor deposition (CVD), it is almost impossible to achieve step coverage at temperatures higher than about 500° C.

FIG. 1B illustrates a cross-sectional view of a stack type three-dimensional capacitor structure. A Ru plug 11 is formed inside a dielectric layer 12, and is connected to a lower electrode 14. A ferroelectric layer 15 and an upper electrode 16 are sequentially formed on the lower electrode 14.

The stack type capacitor structure of FIG. 1B is more easily formed than the trench type capacitor structure shown in FIG. 1A, because the ferroelectric layer is not affected by step coverage in accordance with the thickness of the lower metal electrode. However, the stack type capacitor structure, which is fabricated by forming a lower electrode and etching the lower electrode as shown in FIG. 1B, also has many problems in its actual manufacturing process, as explained in detail below.

First, since a chemically stable precious metal is normally used for the lower electrode 14, e.g., Ir, platinum (Pt), or Ru, it is almost impossible to etch the lower electrode in a vertical direction. Thus, in practice, the etching is normally performed at an angle of about 70°. However, this increases the area of the capacitor, since the lower surface becomes greater than the upper surface. As a result, the unit cell area of a memory device also increases, thereby decreasing integration.

Second, production is expensive. Since the area of the three-dimensional capacitor structure is primarily increased by the area of the lateral sides of the lower electrode 14, the lower electrode 14 should be as thick as possible in the stack type capacitor. However, considering the cost of the precious metal used in the lower electrode 14, such a thick lower electrode 14 is not desirable. Additionally, the time for deposition and etching of the lower electrode 14 is lengthened, further increasing the production cost.

Third, the stack type capacitor formed by etching may not improve fatigue characteristics of the metal oxide electrode. When an electric field is applied to the upper electrode and the lower electrode, a polarization phenomenon of the ferroelectric layer is generated in vertical portions of the upper and lower electrodes and in a vertical direction. Oxygen atoms move in the metal oxide electrode along the direction perpendicular to the electric field, thereby improving fatigue characteristics. In order to realize the stack type capacitor by etching, if a lower metal layer is coated on the metal oxide electrode and etched, the ferroelectric layer formed on the lower electrode may show good fatigue characteristics, since the metal oxide electrode is perpendicular to the electric field. However, the metal oxide electrode on the lateral side of the lower electrode is not perpendicular to the electric field, thereby deteriorating fatigue characteristics.

SUMMARY OF THE INVENTION

The present invention is therefore directed to a capacitor for a memory device and a method for forming the same, which substantially overcome one or more of the problems due to the limitations and disadvantages of the related art.

It is a feature of an embodiment of the present invention to provide a vertical stack-type capacitor of a memory device, and method of forming the same, which can be formed without etching a lower electrode.

It is another feature of an embodiment of the present invention to provide a vertical stack-type capacitor of a memory device, and method of forming the same, having improved fatigue characteristics.

It is yet another feature of an embodiment of the present invention to provide a vertical stack-type capacitor of a memory device, and method of forming the same, that reduces production costs.

It is still another feature of an embodiment of the present invention to provide a vertical stack-type capacitor of a memory device, and method of forming the same, which increases capacitance and integration.

At least one of the above and other features and advantages of the present invention may be realized by providing a capacitor of a memory device including a transistor structure, the capacitor including a lower electrode electrically coupled to a doping region of the transistor structure, the lower electrode including a metal electrode and a metal oxide electrode, a ferroelectric layer covering a top surface of the lower electrode and extending along a side of the lower electrode, and an upper electrode formed on the ferroelectric layer.

The metal electrode may protrude from the transistor structure and the metal oxide electrode may be formed in a vertical trench of the metal electrode. The lower electrode may be cylindrical. The capacitor may further include an oxidation stop layer between the transistor structure and the lower electrode. The oxidation stop layer may be titanium nitride (TiN) and/or titanium aluminum nitride (TiAlN). The capacitor may further include an insulating layer around a lower lateral portion of the lower electrode and on the transistor structure. An adhesion layer may be formed on the insulating layer. The ferroelectric layer may extend to an upper surface of the adhesion layer. The adhesion layer may be composed of a material including at least one selected from the group consisting of titanium (Ti), titanium nitride (TiN), titanium dioxide (TiO2), and titanium aluminum nitride (TiAlN).

At least one of the above and other features and advantages of the present invention may be realized by providing a method of fabricating a capacitor of a memory device including a transistor structure, the method including providing an insulating layer including a trench, depositing a metal and a metal oxide inside the trench, thereby forming a lower electrode, and sequentially forming a ferroelectric layer and an upper electrode on the lower electrode.

Forming the lower electrode may further include partially filling the trench with the metal and filling the trench with the metal oxide. Partially filling the trench may include providing the metal on a bottom and sides of the trench, with a recess remaining in the metal within the trench. A portion of the insulating material may be removed.

The method may further include, prior to forming the insulating layer, sequentially forming an adhesion layer and a second insulating layer, wherein removing the insulating material exposes the adhesion layer. Sequentially forming the ferroelectric layer may include providing a ferroelectric material on the adhesion layer. Sequentially forming the ferroelectric layer may include removing portions of the ferroelectric material from the adhesion layer, in a direction parallel to the adhesion layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
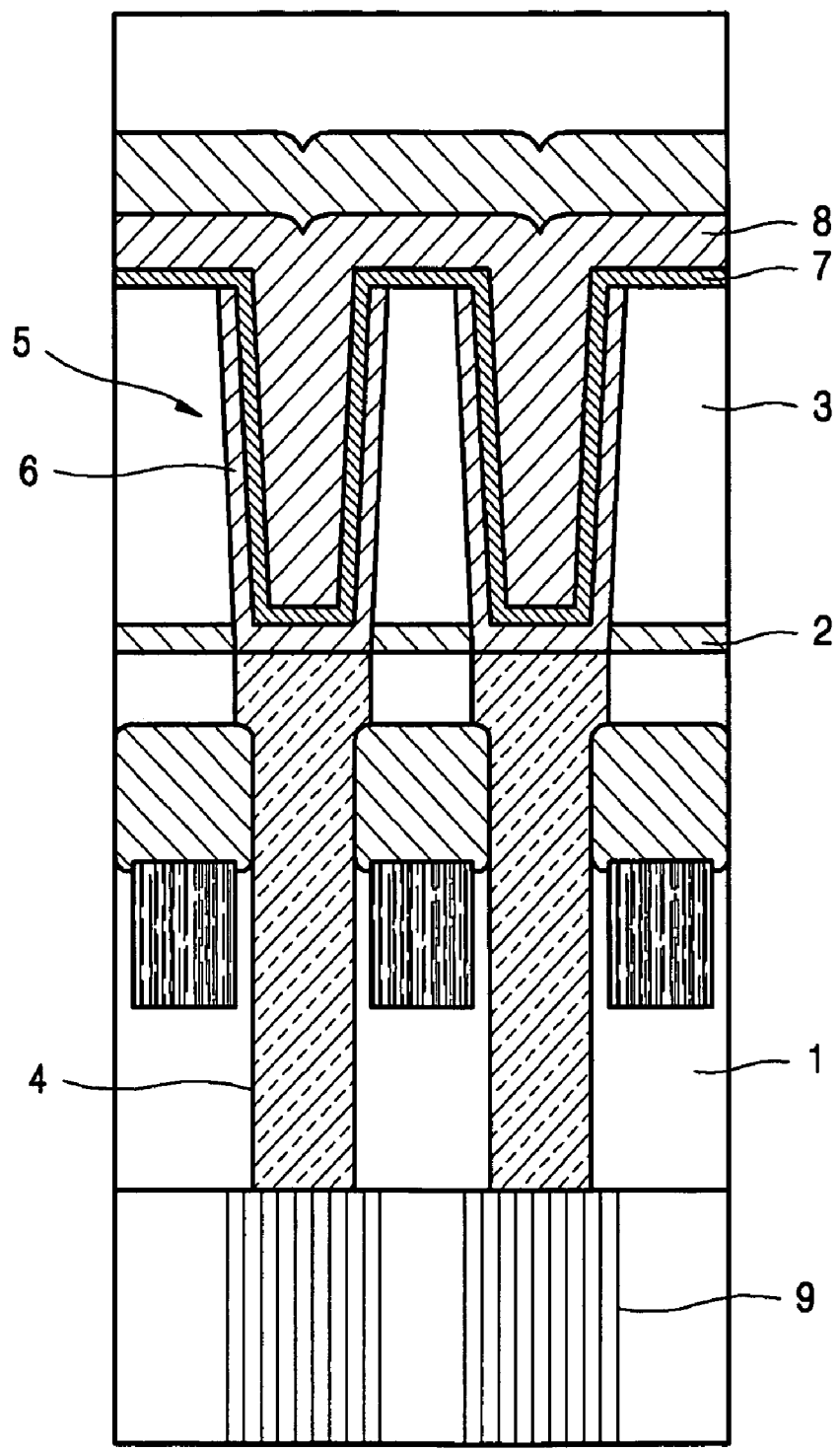
FIGS. 1A and 1B illustrate cross-sectional views of conventional capacitors of a memory device.
Figure 1B:
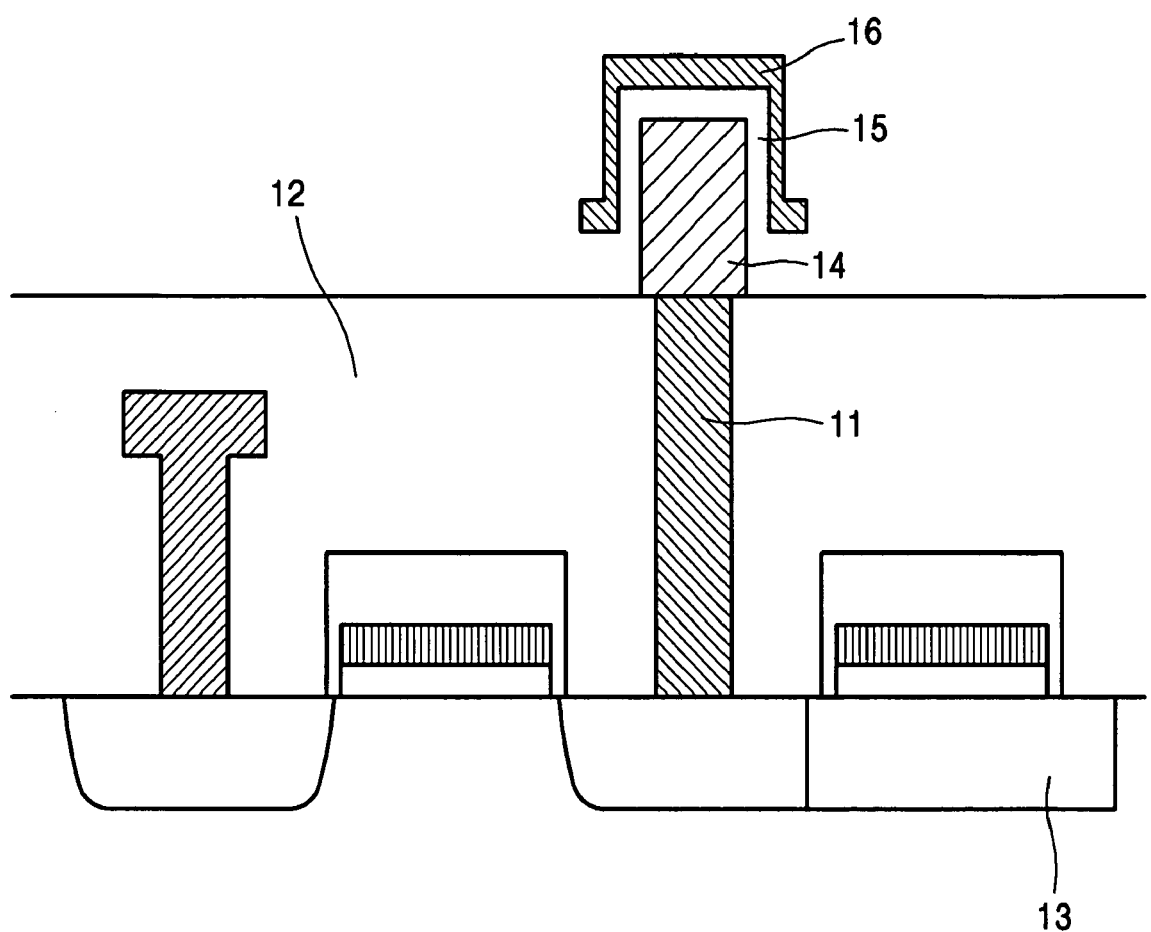

Korean Patent Application No. 10-2004-0030928, filed on May 3, 2004, in the Korean Intellectual Property Office, and entitled: "Capacitor of a Memory Device and Fabrication Method Thereof," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2A:
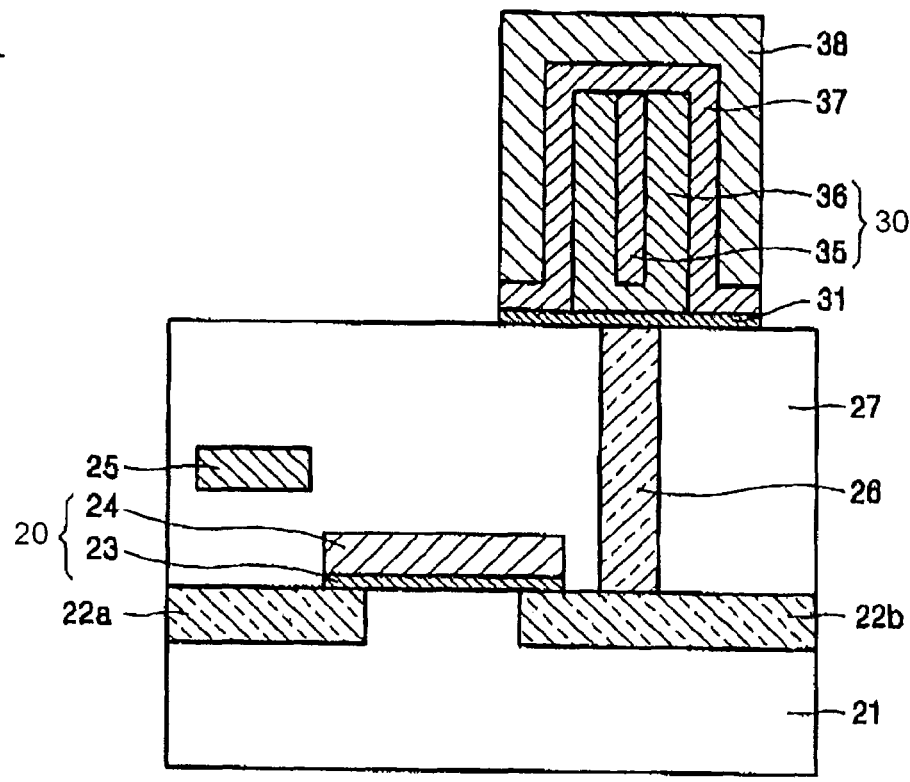
FIG. 2A illustrates a cross-sectional view of a capacitor of a memory device according to a first embodiment of the present invention.

FIG. 2A illustrates a cross-sectional view of a capacitor of a memory device according to a first embodiment of the present invention. Referring to FIG. 2A, a capacitor of the first embodiment of the present invention is formed on a lower structure including a transistor structure. The transistor structure shown in FIG. 2A is identical to the lower structure of a conventional memory device. For example, a first doping region 22a and a second doping region 22b are formed in predetermined portions of a semiconductor substrate 21, and the first doping region 22a and the second doping region 22b are doped with a polarity opposite to that of the semiconductor substrate 21. A gate structure 20 is formed on the semiconductor substrate 21 between the first doping region 22a and the second doping region 22b. The gate structure 20 includes a gate insulating layer 23 and a gate electrode 24. The transistor structure also includes a bit line 25 and a metal plug 26 connected to the second doping region 22b.

A capacitor of a memory device according to the first embodiment of the present invention is then formed on the lower structure described above. A lower electrode 30 including a metal electrode 36 and a metal oxide electrode 35 is formed on an oxidation stop layer 31. In the particular example shown, the lower electrode 30 has a cylindrical shape. A ferroelectric layer 37 and an upper electrode 38 are sequentially formed and surround, i.e., cover a top surface and lateral surfaces, the lower electrode 30.

Figure 2B:
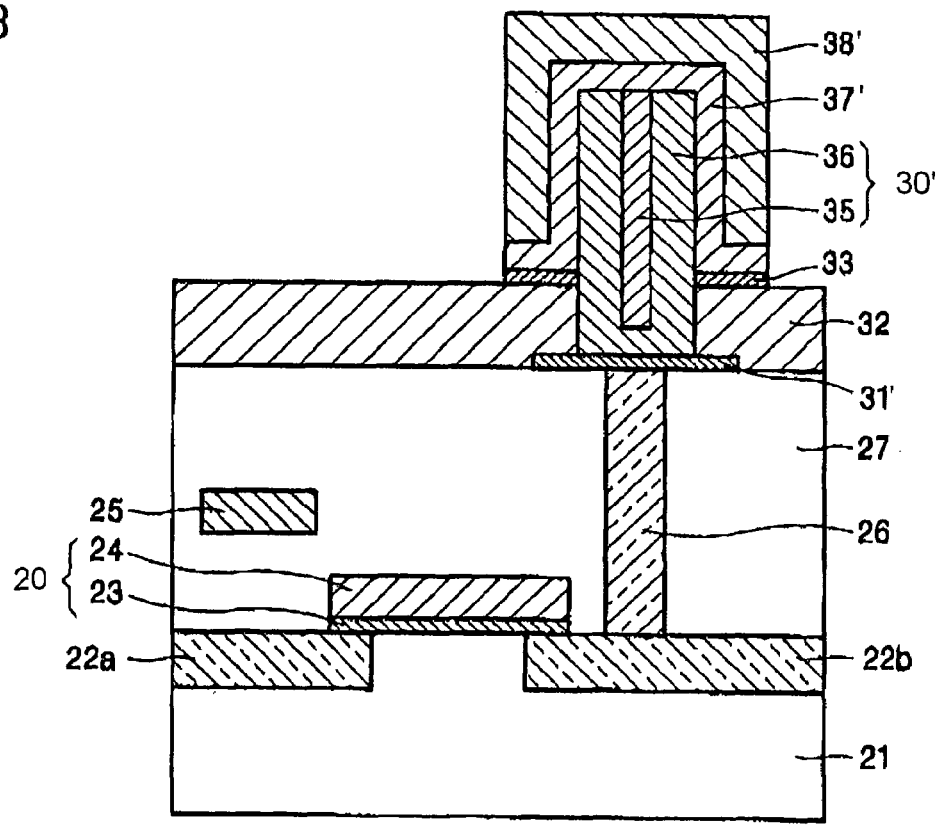
FIG. 2B illustrates a cross-sectional view of a capacitor of a memory device according to a second embodiment of the present invention.

FIG. 2B illustrates a cross-sectional view of a capacitor of a memory device according to a second embodiment of the present invention. Referring to FIG. 2B, a capacitor of the second embodiment of the present invention is formed on a lower structure including a transistor structure. The transistor structure shown in FIG. 2B is identical to the conventional lower structure shown in FIG. 2A, and will not be described again in detail. Again, the transistor structure shown in FIG. 2B includes the first doping region 22a and the second doping region 22b in the semiconductor substrate 21, the gate structure 20 between the first doping region 22a and the second doping region 22b and including the gate insulating layer 23 and the gate electrode 24, the bit line 25 and the metal plug 26 connected to the second doping region 22b.

A capacitor of a memory device according to the second embodiment of the present invention is formed on the lower structure described above. A lower electrode 30' had a cylindrical shape, and includes a metal electrode 36' and a metal oxide electrode 35' formed on an oxidation stop layer 31'. An insulating layer 32 and an adhesion layer 33 are formed on the oxidation stop layer 31' and surround a lower lateral portion of the lower electrode 30'. A ferroelectric layer 37' and an upper electrode 38' are sequentially formed on the adhesion layer 33, and cover the top surface and the remaining lateral surface of the lower electrode 30'.

The capacitor of a memory device according to the second embodiment of the present invention differs from that of the first embodiment in the inclusion of the insulating layer 32 which supports the lateral sides of the lower electrode 30'. This support is especially advantageous when the lower electrode 30' has a high aspect ratio. When the lower electrode 30' has a low aspect ratio, then the capacitor according to the first embodiment of the present invention, which is simpler, may be used.

Hereinafter, referring to accompanying drawings, a method of fabricating a capacitor of a memory device according to the first embodiment of the present invention will be explained in more detail, referring to FIGS. 3A through 3F, which illustrate cross-sectional views of stages in a method of fabricating a capacitor of a memory device according to the first embodiment of the present invention.

Figure 3A:
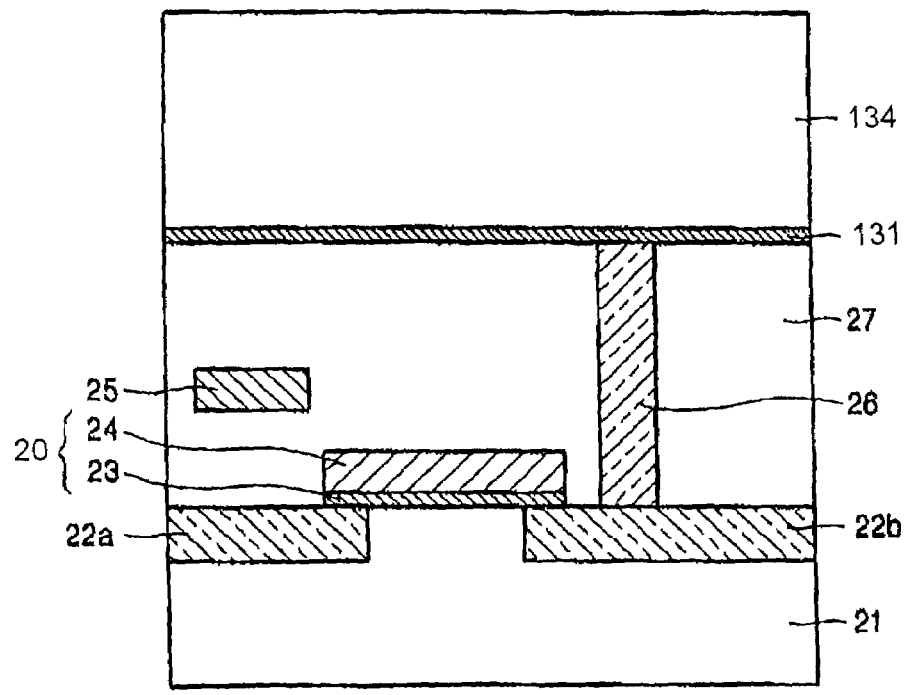
FIGS. 3A through 3F illustrate cross-sectional views of stages in a method of fabricating a memory device according to a first embodiment of the present invention.

Referring to FIG. 3A, an oxidation stop material 131 is formed on a lower structure having the metal plug 26, which is electrically connected to the second doping region 22b of a transistor structure, and an insulating material 134 is formed on the oxidation stop material 131. Since the lower structure is a conventional transistor structure, it can be briefly explained as follows. A transistor structure having the gate insulating layer 23 and the gate electrode 24 is formed, and an interlayer insulating layer 27, e.g., $SiO_2$, is deposited. Then, a predetermined portion is etched, thereby forming a hole for electrically connecting the second doping region 22b and a ferroelectric capacitor. A conductive material, e.g., tungsten (W), is deposited and then planarized, e.g., using a CMP process, thereby completing the formation of the lower structure.

The oxidation stop material 131, e.g., a metal nitride, such as titanium aluminum nitride (TiAlN) or titanium nitride (TiN), is deposited to prevent oxidation of the conductive plug 26 in the oxidation atmosphere used for deposition of a ferroelectric thin film. The deposition thickness and deposition apparatus may be selectively adjusted. For example, the oxidation stop material 131 may be deposited to a thickness around about 5 nm using metal oxide chemical vapor deposition (MOCVD) or atomic layer deposition (ALD). Then, the insulating material 134, e.g. $SiO_2$, is formed on the oxidation stop material 131, e.g., using PECVD.

Figure 3B:
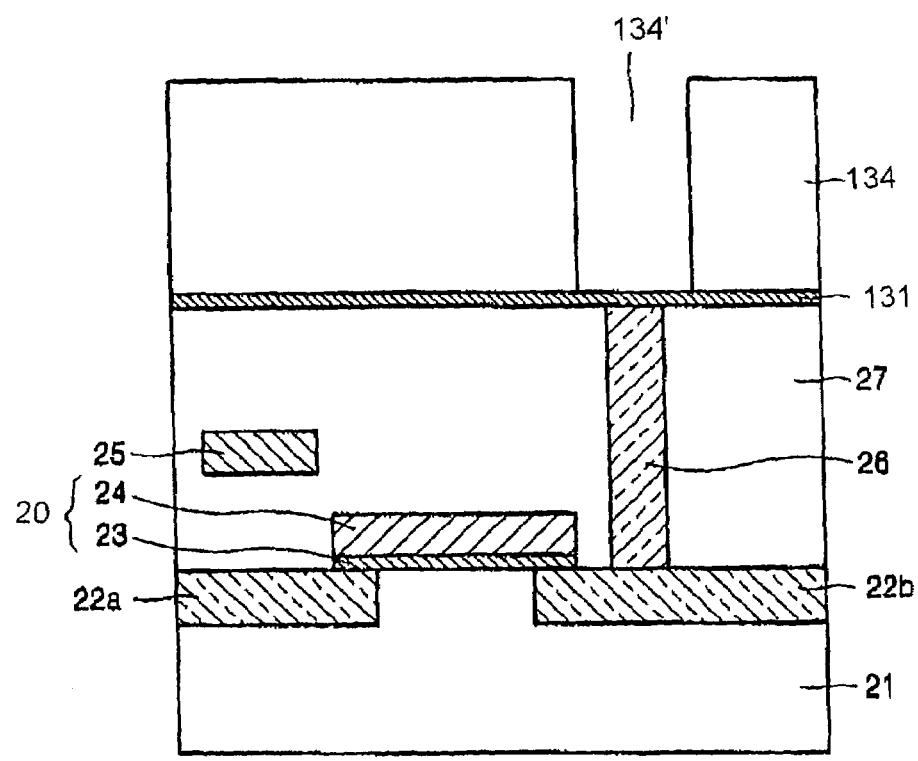

Then, as shown in FIG. 3B, a trench or hole 134' is formed, e.g., using dry etching, on a portion of the insulating material 134 corresponding to the conductive plug 26, with a diameter of tens or hundreds of nm.

Figure 3C:
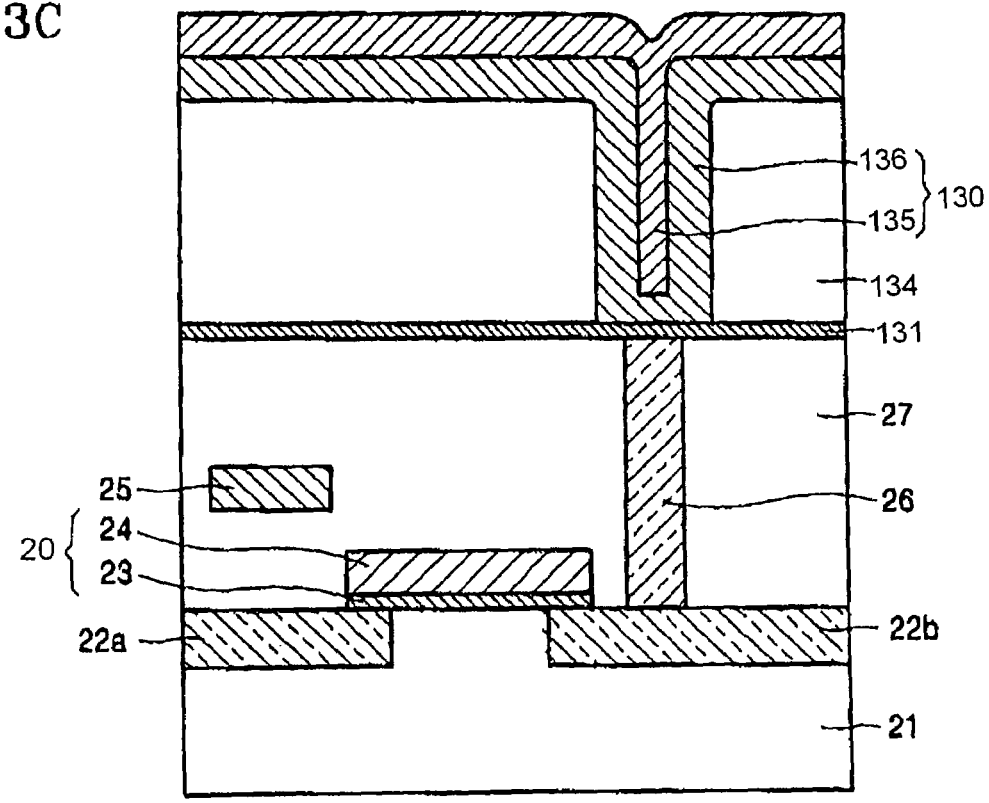

Then, as shown in FIG. 3C, a metal electrode layer 136, e.g., Pt, Ir, Ru, palladium (Pd), or rhodium (Rh), is formed, e.g., using an ALD process. A metal oxide electrode layer 135, e.g., $RuO_2$, $IrO_2$, strontium ruthenium oxide (SrRuO) or calcium ruthenium oxide (CaRuO), is formed on the metal electrode layer 136, thereby forming a hybrid lower electrode layer 130 including the metal/metal oxide electrode layers 136, 135.

Figure 3D:
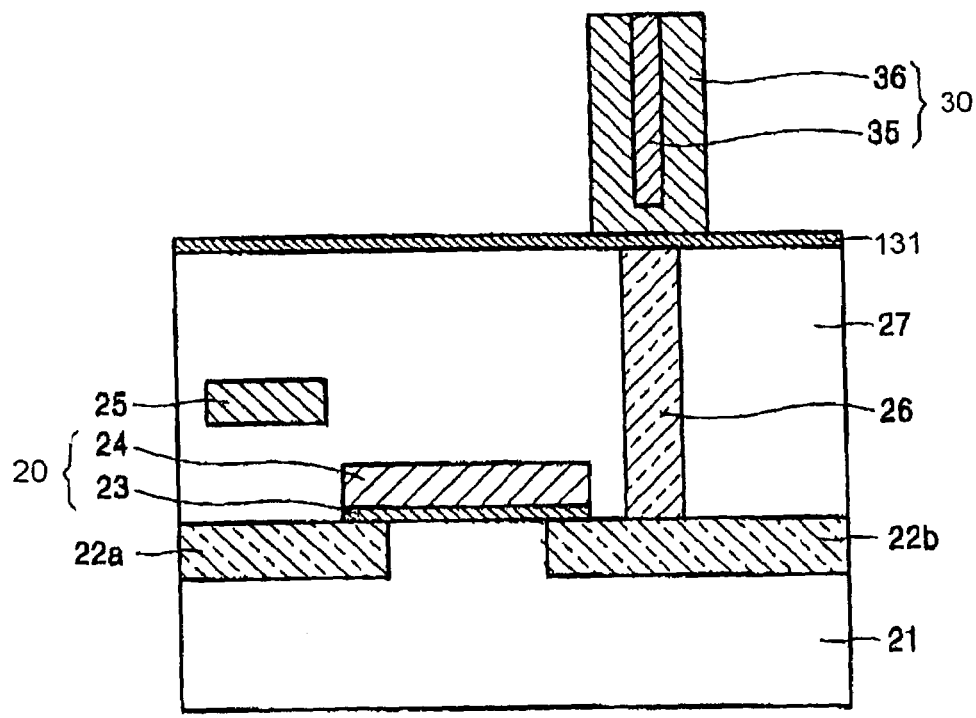

Then, as shown in FIG. 3D, the metal/metal oxide electrode layers 136, 135 formed on the insulating layer 134 are removed and planarized, e.g., using a CMP process, and the insulating layer 32 is removed, e.g., by chemical etching, e.g., using a buffered oxide etching (BOE) process. Thus, only the cylinder of the metal/metal oxide electrodes 36, 35 remains on the oxidation stop material 131.

Figure 3E:
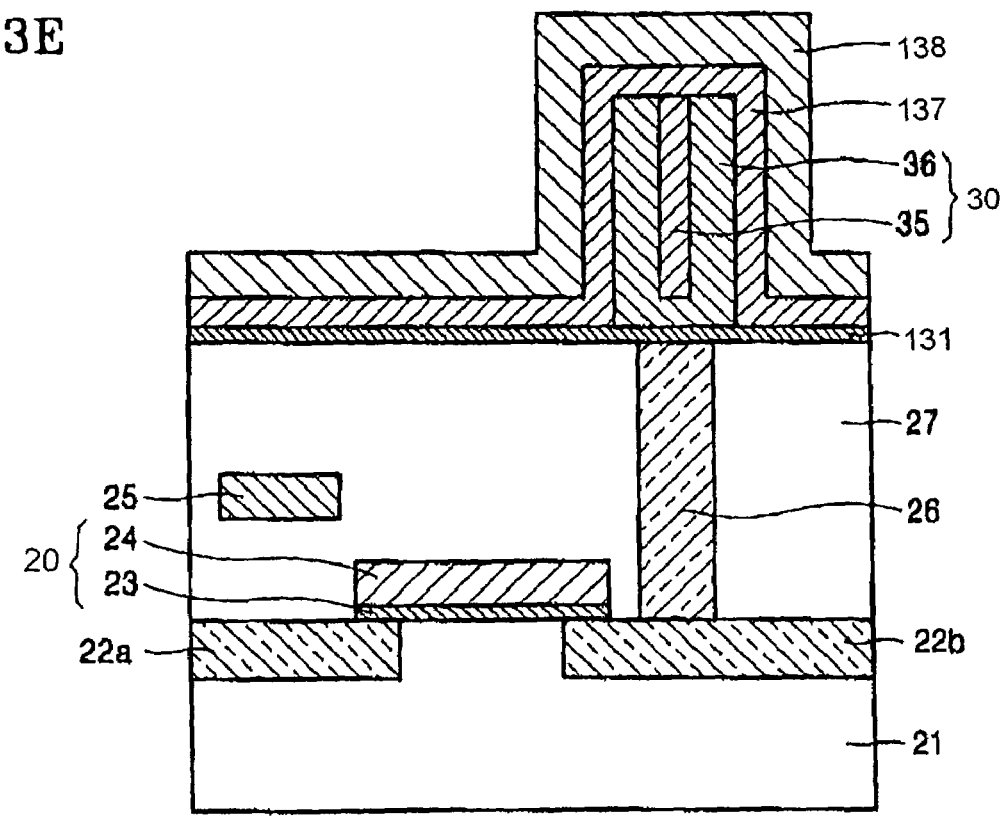

Then, as shown in FIG. 3E, a ferroelectric material 137 is provided on the lower electrodes 35, 36, e.g., an MOCVD process at a temperature of about 500° C., and a material, e.g., Ir or Ru, is deposited on the ferroelectric layer 37, e.g., using an ALD method, thereby forming an upper electrode layer 138.

Figure 3F:
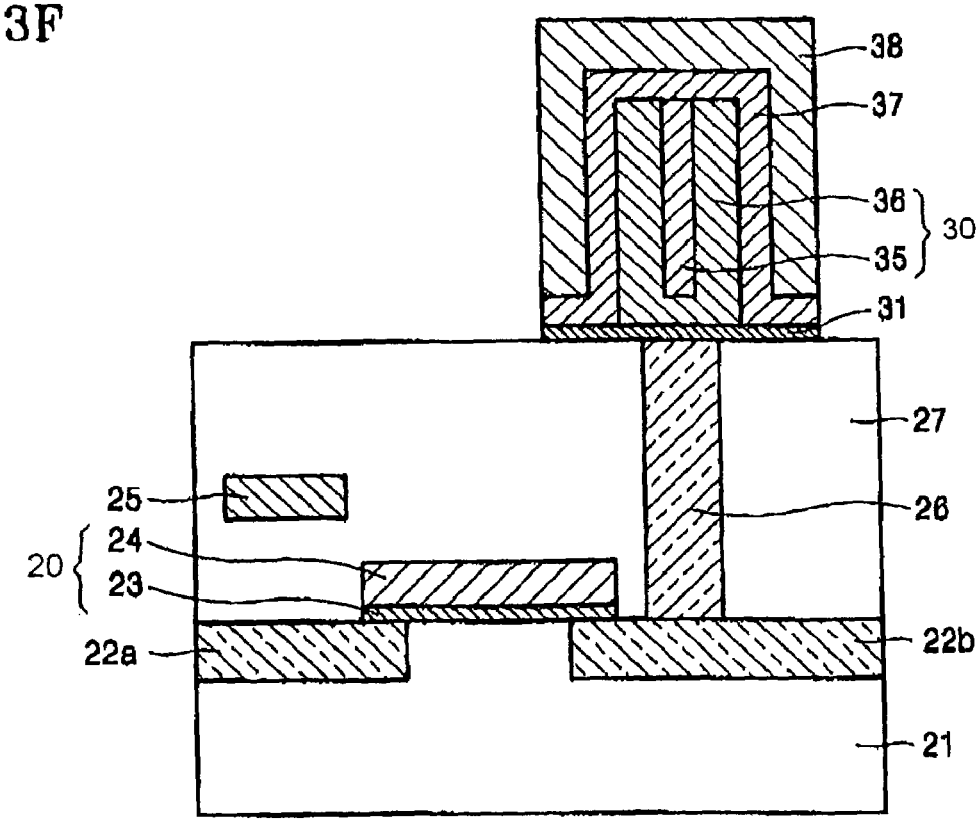

Then, as shown in FIG. 3F, a portion of the ferroelectric material 137 and a portion of the upper electrode layer 138 extending beyond the vertical portion of the upper electrode layer 138 are removed, e.g., by patterning and etching. A portion of the oxidation stop material 131 that extends beyond this vertical portion may also be removed. Thus, the capacitor of a memory device according to the first embodiment of the present invention including the upper electrode 38, the ferroelectric layer 37, and the lower electrode 30 is formed. As shown in FIG. 3F, the capacitor of the first embodiment of the present invention includes the lower electrode 30 having the metal electrode 35 and the metal oxide electrode 36 formed in a vertical recess of the metal electrode 35, the ferroelectric layer 37 covering the top and sides of the lower electrode 30 and the upper electrode 38 on the ferroelectric layer 37.

Hereinafter, a method of fabricating a capacitor of a memory device according to the second embodiment of the present invention will be explained in detail referring to FIGS. 4A through 4F, which illustrate cross-sectional views of stages in a method of fabricating a capacitor of a memory device according to the second embodiment of the present invention.

Figure 4A:
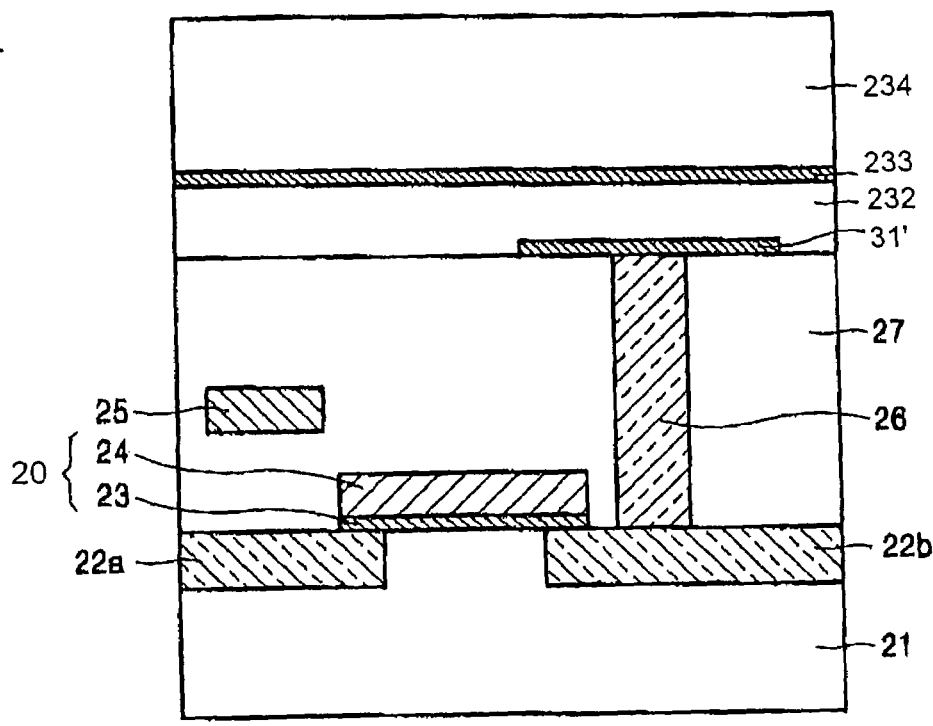
FIGS. 4A through 4F illustrate cross-sectional views of stages in a method of fabricating a memory device according to a second embodiment of the present invention.

Referring to FIG. 4A, the oxidation stop layer 31 is formed on the lower structure having the metal plug 26, which is electrically connected to the second doping region 22b of the transistor structure. An insulating material 232 is formed on the oxidation stop layer 31. Since the lower structure is a conventional transistor structure, a detailed explanation will be omitted here.

The oxidation stop layer 31, e.g., a metal nitride such as TiAlN or TiN, is deposited to prevent oxidation of the conductive plug 26 in the oxidation atmosphere used for deposition of a ferroelectric thin film. The deposition thickness and deposition apparatus may be selectively adjusted. For example, the oxidation stop layer 31 may be deposited to a thickness of about 5 nm using MOCVD or ALD. The oxidation stop layer 31 can be formed to have a predetermined length, e.g., by providing an oxidation stop material and patterning it to the predetermined length. Then, the insulating material 232, e.g., SiO$_2$, is formed, e.g., using PECVD, on the oxidation stop layer 31. An adhesion material 233, e.g., Ti, TiN, titanium dioxide (TiO$_2$), or TiAlN, is deposited on the insulating material 232. A second insulating material 234, e.g., SiO$_2$, is formed on the adhesion material 233. Since the insulating material 232 is to remain in the final structure of the capacitor according to the second embodiment of the present invention, the adhesion material 233 prevents problems that may occur if the insulating material 232 directly contacts ferro electric material. For example, ,some of the insulating material may diffuse into the ferroelectric material or the layers of the ferroelectric material and the insulating material may separate from each other because of poor adhesion at their interface.

Figure 4B:
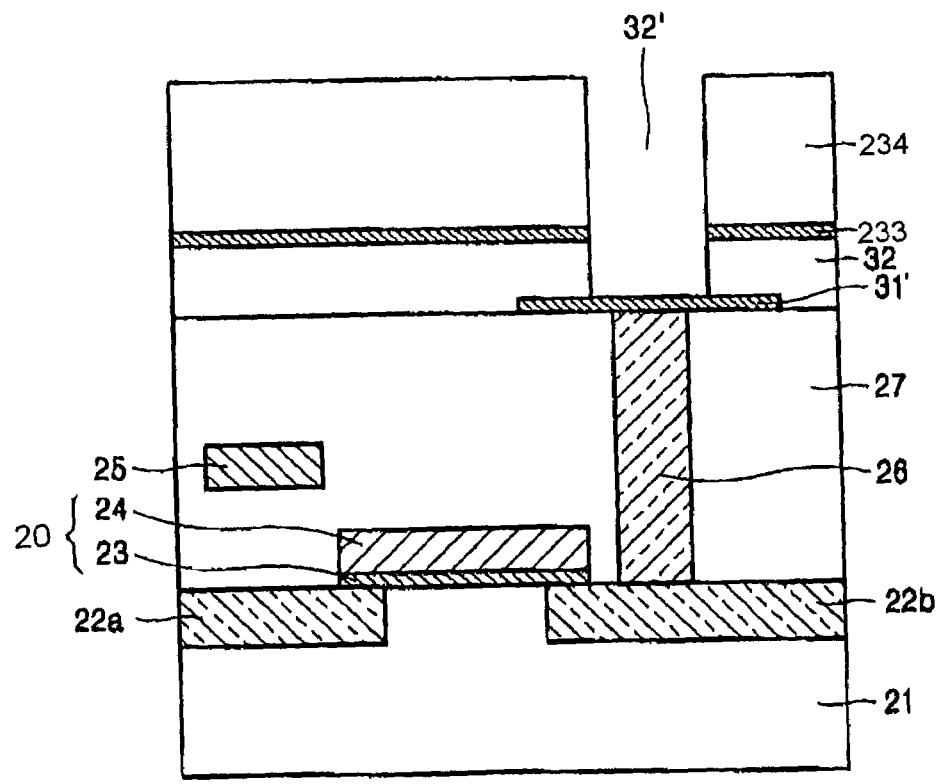

Then, as shown in FIG. 4B, a trench or hole 234' having diameter of ten or hundreds of nanometers is formed in portions of the insulating material 232, the adhesion materal 233, and the second insulating materal 234 corresponding to the conductive plug 26, e.g., using dry etching.

Figure 4C:
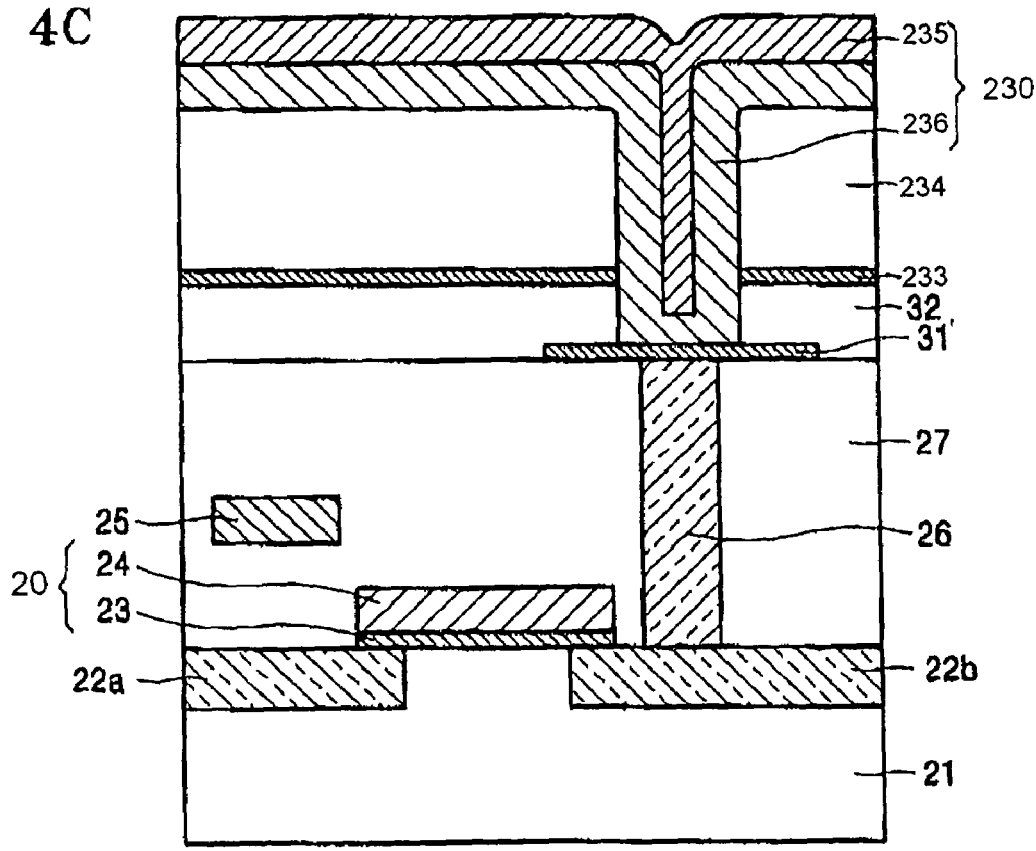

Then, as shown in FIG. 4C, a metal electrode layer 236, e.g., Pt, Ir, Ru, Pd, or Rh, is deposited, e.g., using an ALD process. Then, a metal oxide electrode layer 235, e.g., RuO$_2$, IrO$_2$, SrRuO, CaRuO, or the like, is formed on the metal electrode layer 236, thereby forming a hybrid lower electrode material 230 including the metal/metal oxide electrode materials 236, 235. The trench or hole 234' can be completely filled with the metal/metal oxide electrode materials 236, 235. The metal electrode material 236 may coat the trench 234', such that a vertical opening remains in the metal electrode layer 236, which the metal oxide electrode material may fill.

Figure 4D:
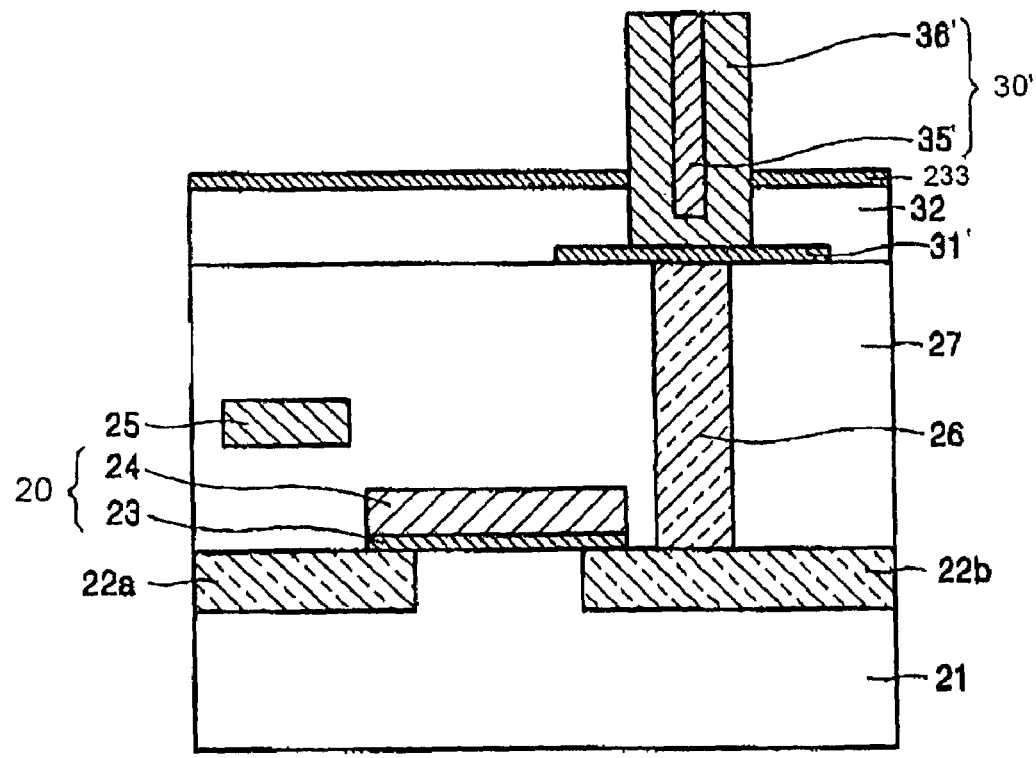

Then, as shown in FIG. 4D, the hybrid electrode material 230 formed on the second insulating material 234 is partially removed and planarized, e.g., using CMP, and the second insulating material 234 is removed, e.g., using a BOE process. Thus, only the cylindrical lower metal/metal oxide electrode 30' remains, with the adhesion material 233 on top of the insulating layer 32 exposed.

Figure 4E:
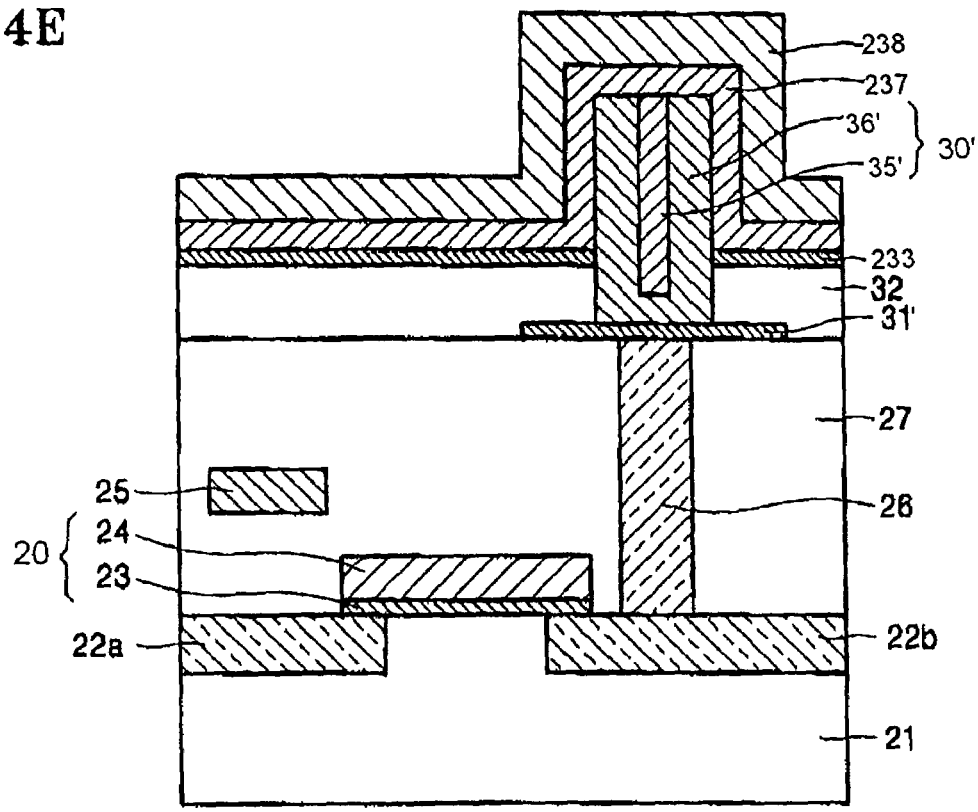

Then, as shown in FIG. 4E, a ferroelectric material 237 is formed on the lower electrode 30', e.g., using an MOCVD process at a temperature of about 500° C., and an upper electrode material 238, e.g., Ir or Ru, is deposited on the ferroelectric material 237, e.g., using an ALD method.

Figure 4F:
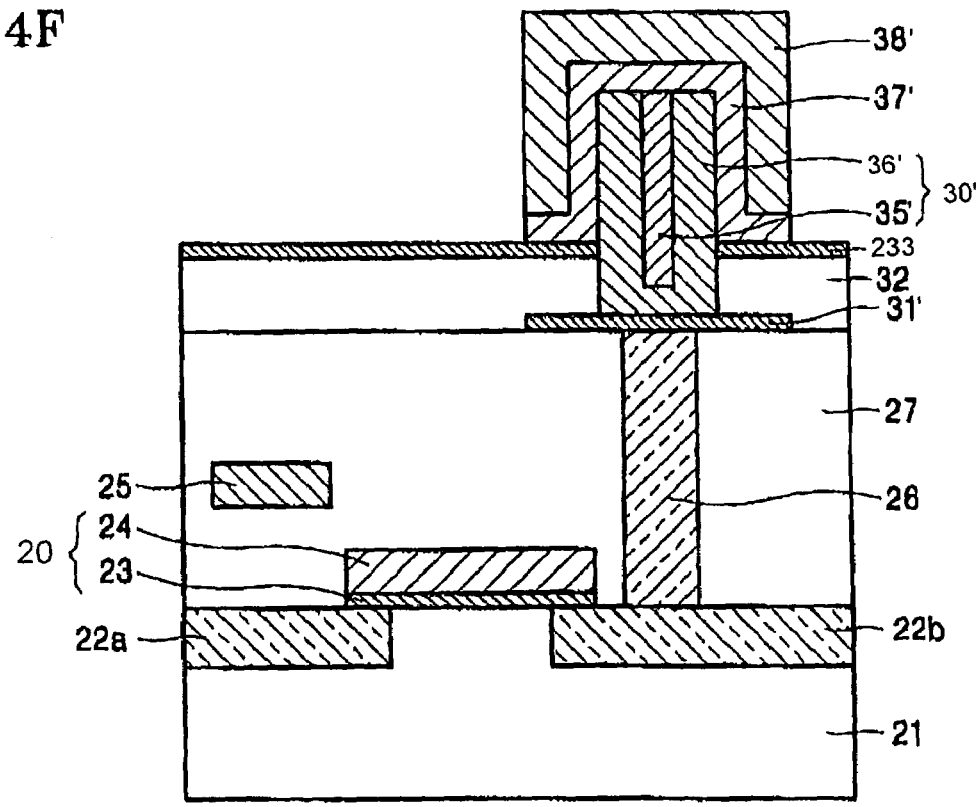

Then, as shown in FIG. 4F, a portion of the ferroelectric material 237 and a portion of the upper electrode material 238 extending beyond the vertical portion of the upper electrode material 238 are removed, e.g., by patterning and etching. The adhesion material 233 that extends beyond this vertical portion may also be removed, as shown in FIG. 2B, Thus, the capacitor of a memory device according to the second embodiment of the present invention including the upper electrode 38', the ferroelectric layer 37', and the lower electrode 30' is formed. As shown in FIG. 4F, the capacitor of the second embodiment of the present invention includes the lower electrode 30' having the metal electrode 35' and the metal oxide electrode 36' formed in a vertical recess of the metal electrode 35', the insulating layer having the adhesion material 233 surrounding a lower portion of the sides of the lower electrode, the ferroelectric layer 37' covering the top and sides of the lower electrode 30 and contacting an upper surface of the adhesion material 233, and the upper electrode 38' on the ferroelectric layer 37'.

As described above, the embodiments of the present invention have the following advantages.

First, the lower electrode has a hybrid structure, including a metal electrode and a metal oxide electrode, thereby providing a three-dimensional capacitor of a memory device having stable fatigue characteristics.

Second, production cost is reduced, since much less of the expensive lower electrode material is wasted in forming the three-dimensional capacitor, and since production time is decreased.

Third, a highly-integrated semiconductor memory device can be realized by providing a stack type three-dimensional ferroelectric capacitor having a high capacitance.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A capacitor of a memory device including a transistor structure, the capacitor comprising:
    a lower electrode electrically coupled to a doping region of the transistor structure, the lower electrode including a metal electrode and a metal oxide electrode;
    an insulating layer surrounding a lower lateral portion of the lower electrode;
    an adhesion layer on an upper surface of the insulation layer, the adhesion layer also surrounding a lower lateral portion of the lower electrode;
    a ferroelectric layer on an upper surface of the adhesion layer, the ferroelectric layer covering both a top surface and an upper lateral portion of the lower electrode; and
    an upper electrode on the ferroelectric layer.

2. The capacitor as claimed in claim 1, wherein the metal electrode protrudes from the transistor structure and the metal oxide electrode is within a vertical trench of the metal electrode.

3. The capacitor as claimed in claim 1, wherein the lower electrode is cylindrical.

4. The capacitor as claimed in claim 1, wherein the capacitor further comprises an oxidation stop layer between the transistor structure and the lower electrode.

5. The capacitor as claimed in claim 4, wherein the oxidation stop layer comprises at least one of titanium nitride (TiN) and titanium aluminum nitride (TiAlN).

6. The capacitor as claimed in claim 1, wherein the adhesion layer is composed of a material including at least one selected from the group consisting of titanium (Ti), titanium nitride (TiN), titanium oxide (TiO$_2$), and titanium aluminum nitride (TiAlN).

* * * * *